United States Patent
Wang et al.

(10) Patent No.: US 9,935,038 B2
(45) Date of Patent: Apr. 3, 2018

(54) SEMICONDUCTOR DEVICE PACKAGES AND METHODS

(75) Inventors: Tsung-Ding Wang, Tainan (TW); Hung-Jen Lin, Tainan (TW); Jiun Yi Wu, Zhongli (TW); Mirng-Ji Lii, Sinpu Township (TW); Chien-Hsun Lee, Chu-tung Town (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 13/444,649

(22) Filed: Apr. 11, 2012

(65) Prior Publication Data

US 2013/0270705 A1 Oct. 17, 2013

(51) Int. Cl.
*H01L 23/482* (2006.01)
*H01L 23/00* (2006.01)
(Continued)

(52) U.S. Cl.
CPC ........ *H01L 23/4824* (2013.01); *H01L 23/488* (2013.01); *H01L 23/49816* (2013.01); *H01L 23/49827* (2013.01); *H01L 23/49838* (2013.01); *H01L 23/528* (2013.01); *H01L 24/09* (2013.01); *H01L 24/16* (2013.01); *H01L 21/563* (2013.01); *H01L 24/05* (2013.01); *H01L 24/13* (2013.01); *H01L 24/81* (2013.01); *H01L 2224/0401* (2013.01); *H01L 2224/05558* (2013.01); *H01L 2224/131* (2013.01); *H01L 2224/13022* (2013.01); *H01L 2224/16* (2013.01); *H01L 2224/16056* (2013.01); *H01L 2224/16146* (2013.01); *H01L 2224/73204* (2013.01); *H01L 2224/81191* (2013.01); *H01L 2224/81192* (2013.01); *H01L 2224/81193* (2013.01); *H01L 2224/81385* (2013.01);
(Continued)

(58) Field of Classification Search
CPC ......... H01L 24/04; H01L 24/05; H01L 24/06; H01L 24/07; H01L 24/08; H01L 24/09; H01L 24/12; H01L 24/13; H01L 24/14; H01L 24/15; H01L 24/16; H01L 24/17; H01L 24/44; H01L 24/45; H01L 24/46; H01L 24/47; H01L 24/48; H01L 24/49
USPC .................................................. 257/666, 790
See application file for complete search history.

(56) References Cited

U.S. PATENT DOCUMENTS 3,537,176 A * 11/1970 Healy et al. .................... 29/843
4,878,098 A * 10/1989 Saito et al. .................. 257/668
(Continued)

FOREIGN PATENT DOCUMENTS

CN          1744303        3/2006
CN      101055857 A       10/2007
(Continued)

*Primary Examiner* — Zandra Smith
*Assistant Examiner* — Abbigale Boyle
(74) *Attorney, Agent, or Firm* — Slater Matsil, LLP

(57) ABSTRACT

Semiconductor devices packages and methods are disclosed. In one embodiment, a package for a semiconductor device includes a substrate and a contact pad disposed on a first surface of the substrate. The contact pad has a first side and a second side opposite the first side. A conductive trace is coupled to the first side of the contact pad, and an extension of the conductive trace is coupled to the second side of the contact pad. A plurality of bond pads is disposed on a second surface of the substrate.

20 Claims, 10 Drawing Sheets

(51) Int. Cl.
*H01L 23/528* (2006.01)
*H01L 23/488* (2006.01)
*H01L 23/498* (2006.01)
*H01L 21/56* (2006.01)

(52) U.S. Cl.
CPC ........... *H01L 2224/81424* (2013.01); *H01L 2224/81447* (2013.01); *H01L 2224/81815* (2013.01); *H01L 2924/181* (2013.01)

(56) References Cited

U.S. PATENT DOCUMENTS

| | | | |
|---|---|---|---|
| 6,028,366 A * | 2/2000 | Abe | 257/779 |
| 6,201,305 B1 * | 3/2001 | Darveaux et al. | 257/779 |
| 6,214,716 B1 * | 4/2001 | Akram | G01R 1/0483 438/612 |
| 6,228,466 B1 * | 5/2001 | Tsukada et al. | 428/209 |
| 6,324,754 B1 * | 12/2001 | DiStefano et al. | 29/840 |
| 6,448,504 B1 * | 9/2002 | Taguchi | 174/255 |
| 6,528,407 B1 * | 3/2003 | Petit et al. | 438/613 |
| 6,936,916 B2 * | 8/2005 | Moxham | H01L 23/13 174/256 |
| 7,115,819 B1 * | 10/2006 | Rumsey | 174/261 |
| 7,750,250 B1 * | 7/2010 | Kuo | 174/264 |
| 8,198,186 B2 * | 6/2012 | Pendse | 438/613 |
| 8,318,537 B2 * | 11/2012 | Pendse | 438/108 |
| 8,461,694 B1 * | 6/2013 | Sirinorakul | 257/777 |
| 2006/0044735 A1 | 3/2006 | Hayashi et al. | |
| 2007/0241457 A1 | 10/2007 | Ida | |
| 2008/0093749 A1 * | 4/2008 | Gerber et al. | 257/784 |
| 2009/0134514 A1 * | 5/2009 | Coffy | H01L 24/03 257/737 |
| 2010/0203676 A1 * | 8/2010 | Theuss | H01L 21/561 438/109 |
| 2010/0212948 A1 * | 8/2010 | Lin | H01L 21/563 174/261 |

FOREIGN PATENT DOCUMENTS

| | | |
|---|---|---|
| TW | I234258 B | 6/2005 |
| TW | I251923 B | 3/2006 |
| TW | 200727440 | 7/2007 |
| TW | 200805606 A | 1/2008 |
| TW | 200832577 | 8/2008 |
| TW | 200834845 | 8/2008 |
| TW | M363079 | 8/2009 |
| TW | 201032305 | 9/2010 |
| TW | 201123381 A | 7/2011 |

* cited by examiner

SEMICONDUCTOR DEVICE PACKAGES AND METHODS

BACKGROUND

Semiconductor devices are used in a variety of electronic applications, such as personal computers, cell phones, digital cameras, as examples. Dozens or hundreds of integrated circuit (IC) dies are typically manufactured on a single semiconductor wafer. The individual dies are singulated by sawing the integrated circuits along a scribe line. The individual dies are then packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications. One type of smaller packaging for semiconductor devices is wafer level chip-scale packaging (WLCSP), which typically includes a redistribution layer (RDL) that is used to fan out wiring for contact pads of IC dies so that electrical contact can be made on a larger pitch than contact pads of the die.

These smaller ICs and smaller packaged IC dies are often used in handheld devices, such as cellular phones. If the end product that the ICs are used in is dropped by a user, failures in the ICs, and thus also the end products, can occur.

What are needed in the art are more rugged small-scale packages for semiconductor devices.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Embodiments of the present disclosure are related to packages for semiconductor devices. Novel packages, methods of packaging, and packaged semiconductor devices will be described herein.

Figure 1:
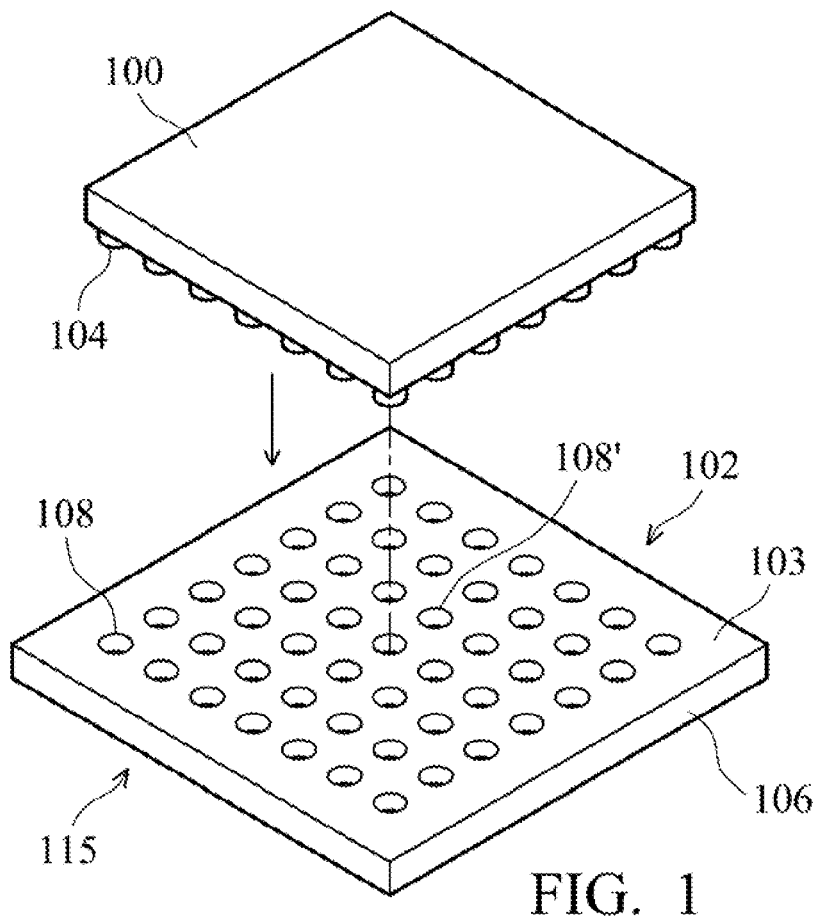
FIG. 1 illustrates a perspective view of an integrated circuit die being packaged with a novel package of the present disclosure in accordance with an embodiment.

Referring first to FIG. 1, a perspective view of a semiconductor device being packaged with a novel package 102 of the present disclosure in accordance with an embodiment is shown. The semiconductor device comprises an integrated circuit die 100 that includes an integrated circuit formed on a workpiece. The workpiece may include a semiconductor substrate comprising silicon or other semiconductor materials and may be covered by an insulating layer, for example. The workpiece of the die 100 may comprise silicon oxide over single-crystal silicon, for example. Compound semiconductors, such as GaAs, InP, Si/Ge, or SiC, as examples, may be used in place of silicon. The workpiece that the integrated circuit die 100 is formed on may comprise a silicon-on-insulator (SOI) or a germanium-on-insulator (GOI) substrate, as examples. A plurality of the integrated circuit dies 100 are manufactured on a single workpiece and are then singulated at scribe lines, separating the workpiece into single dies 100.

The integrated circuit die 100 may include one or more components and/or circuits formed in and/or over the workpiece, not shown. The integrated circuit die 100 may include conductive layers and/or semiconductor elements, e.g., transistors, diodes, capacitors, etc., also not shown. The die 100 comprises a square or rectangular shape in a top view. The integrated circuit die 100 may comprise logic circuitry, memory devices, or other types of circuits, as examples. The integrated circuit die 100 includes a plurality of contacts (not shown in FIG. 1; see contacts 132 in FIG. 6) formed on a bottom surface thereof.

A plurality of solder balls 104 is formed on the bottom surface of the integrated circuit die 100, e.g., on the plurality of contacts 132 on the bottom surface of the integrated circuit die 100. The solder balls 120 may comprise microbumps or solder bumps, as examples. The solder balls 104 may be arranged in an array of rows and columns. The solder ball 104 pattern comprises the same pattern as an array region 115 of contact pads 108 and 108' on a top surface of the package 102.

The package 102 includes a substrate 106. In some embodiments, the substrate 106 comprises a printed circuit board (PCB), for example. The package 102 comprises a wafer level chip scale package (WLCSP) in some embodiments, for example. The substrate 106 may include through-substrate vias (TSVs), wiring, and a redistribution layer (RDL), to be described further herein. Alternatively, the substrate 106 may comprise other materials, the package 102 may comprise other types of packages, and the wiring of the substrate 106 may comprise other materials and configurations.

The substrate 106 includes contact pads 108 and 108' formed in the array region 115 on a top surface thereof. Contact pads 108 are disposed in corners or corner regions (not shown in FIG. 1; see corners 112 and corner regions 114 in FIG. 3) of the array region 115 on the substrate 106, and contact pads 108' are disposed elsewhere on the substrate, e.g., in central regions and edge regions of the array region 115. The contact pads 108 and 108' comprise a metal such as Cu, Al, alloys thereof, other metals, or combinations thereof, as examples. The substrate 106 also includes conductive traces 120 (not shown in FIG. 1; see FIG. 3) coupled to the contact pads 108 and 108', to be described further herein. The contact pads 108 and 108' and the conductive traces 120 may comprise etch runs and/or traces of wiring in a conductive material layer of the substrate 106. Portions of the substrate 106 or an insulating material disposed over the substrate 106 may be removed to expose the contact pads 108 and 108' so that they may be electrically contacted by the solder balls 104 on the die 100 during the packaging process, for example.

To package the integrated circuit die 100, the solder balls 104 on the integrated circuit die 100 are attached to the contact pads 108 and 108' on the top surface 103 of the substrate 106 of the package 102. A solder reflow process is used to reflow the solder of the solder balls 104 and attach the integrated circuit die 100 to the package 102, electrically and mechanically attaching the solder balls 104 to the contact pads 108 and 108' on the substrate 106 and forming solder joints (see solder joints 130 in FIG. 6) between the die 100 and the package 102, for example. The solder balls 104 may alternatively be attached to the substrate 106 of the package 102 using other methods.

For example, in some embodiments, solder balls (not shown in FIG. 1; see solder balls 148 in FIG. 7) may alternatively be attached to the contact pads 108 and 108' of the package 102 rather than to the contacts 132 on the die 100. The solder material of the solder balls 148 is reflowed as described for the embodiment in which the solder balls 104 are attached to the contacts on the die 100. In yet another embodiment, solder balls 104 and 148 and may be attached to both the die 100 and the package 102, respectively.

In some embodiments, the integrated circuit die 100 is attached to the package 102 using a flip-chip bond-on-trace (BOT) attachment technique. The contact pads 108 and 108' may include bump-on-trace patterns that are used to attach a die 100 to the substrate 102, wherein the integrated circuit die 100 is packaged using a BOT packaging technique. Alternatively, the patterns of the contact pads 108 and 108' may comprise patterns typically used for solder balls, in other embodiments. Other flip-chip attachment techniques and other types of contact pads 108 and 108' may also be used to attach the integrated circuit die 100 to the package 102.

Figure 2:
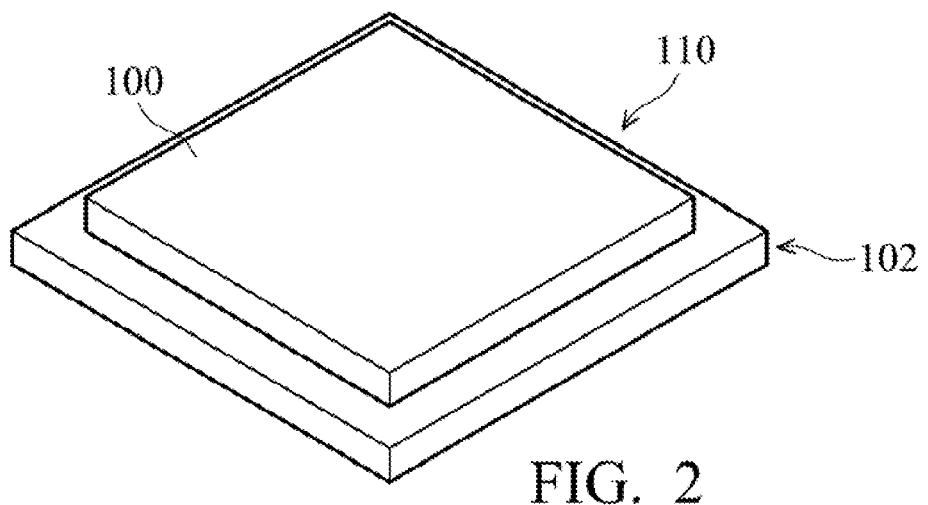
FIG. 2 is a perspective view of a packaged semiconductor device after the packaging process shown in FIG. 1 in accordance with an embodiment.

FIG. 2 is a perspective view of a packaged semiconductor device 110 after the packaging process shown in FIG. 1 in accordance with an embodiment. The solder balls 104 on the integrated circuit die 100 are coupled to the contact pads 108 and 108' on the package 102 by the plurality of solder joints 130 shown in FIG. 6.

Figure 3:
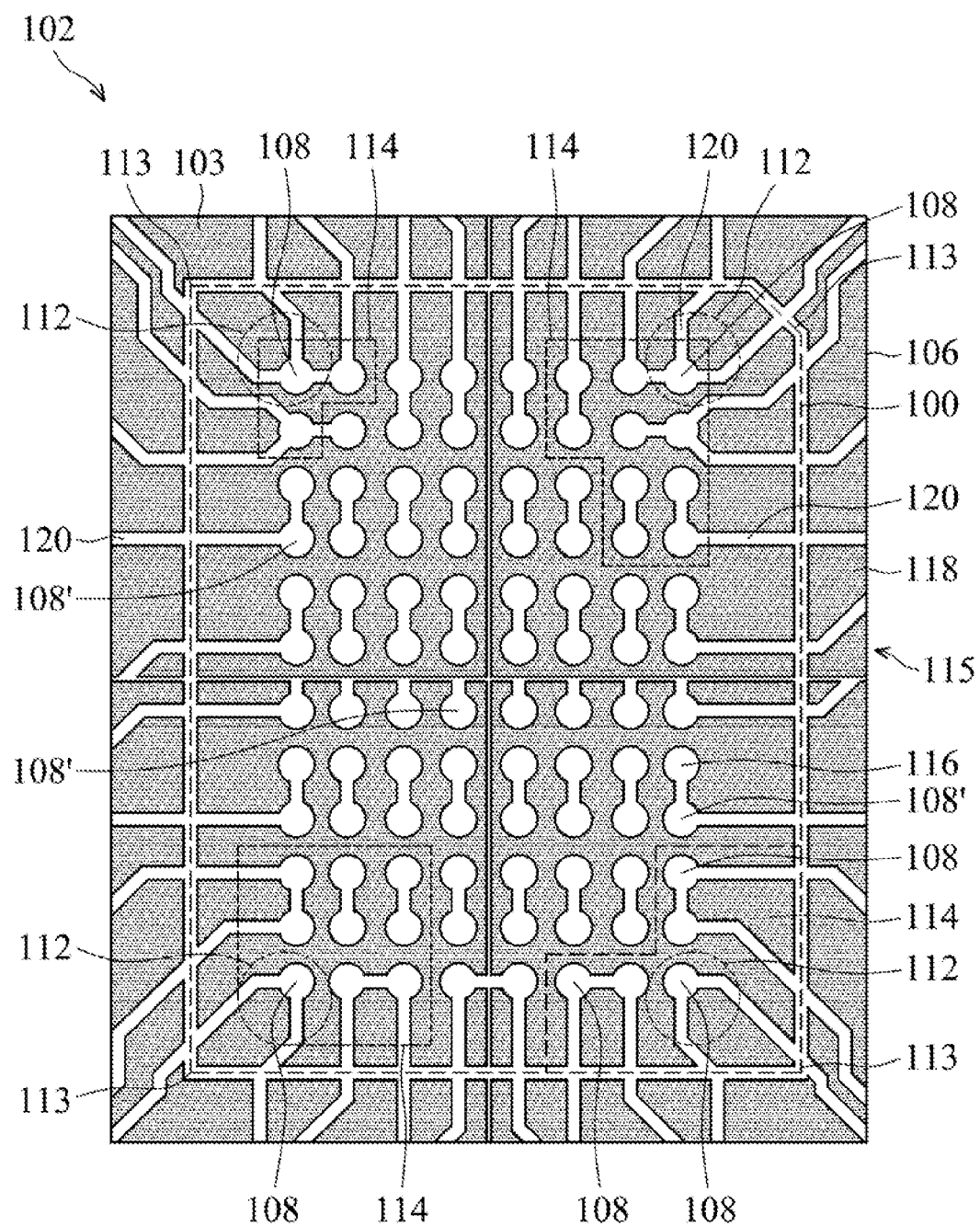
FIG. 3 shows a top view of a top surface of the package having a plurality of contact pads and conductive traces formed thereon.

FIG. 3 shows a top view of a top surface 103 of the package 102 having a plurality of contact pads 108 and 108' and conductive traces 120 formed thereon. A region where the die 100 will be attached is shown in phantom, i.e., by dashed lines. Contact pads 108 are also referred to herein (e.g., in the claims) as first contact pads 108, and contact pads 108' are also referred to here as second contact pads 108'. An integrated circuit die 100 is coupled to the first contact pads 108 and the second contact pads 108' using the solder joints 130 shown in FIG. 6 in accordance with embodiments of the present disclosure.

Referring again to FIG. 3, contact pads 108 are formed in corners 112 or corner regions 114 of the array region 115 of the contact pads 108 and 108' formed on the substrate 106. One contact pad 108 may be formed in each corner 112 of the array region 115. Alternatively, a plurality of contact pads 108 may be formed in the corner regions 114 of the array region 115.

Some examples of patterns of the corner regions 114 are shown in FIG. 3. In the top left corner region 114, three contact pads 108 are included: the corner contact pad 108 and one contact pad 108 to the right, and another contact pad 108 below the corner contact pad 108. In the top right corner region 114, two rows of contact pads 108 are included, and the corner contact pad 108 and two adjacent contact pads 108 are also included. In the bottom left corner region 114, a block of 3×3 corner pads 108 is included. In the bottom right corner region 114, a single row of three contact pads 108 including the corner contact pad 108 is included. Alternatively, the patterns of contact pads 108 in the corner regions 114 may comprise a wide variety of other configurations, depending on the design.

Contact pads 108 in corners 112 and corner regions 114 include extensions 124 (see FIG. 4A) that improve solder joint 130 (see FIG. 6) formation in accordance with embodiments, to be described further herein. Referring again to FIG. 3, other contact pads 108' are located along the edge of the array region 115 and/or in the center of the array region 115 of contact pads 108 and 108'. One or more of the contact pads 108 and 108' may be coupled to a via 116 that is adjacent the contact pads 108 and 108'. The via 116 may comprise a through-substrate via (TSV) in some embodiments.

The conductive traces 120 and contact pads 108 and 108' are formed on a single metallization layer of the substrate 106 in some embodiments. The conductive traces 120 and contact pads 108 and 108' are formed by depositing a layer of conductive material and patterning the layer of conductive material using lithography. The conductive traces 120 and contact pads 108 and 108' may also be formed using damascene techniques, by first depositing an insulating material, patterning the layer of insulating material, and filling the patterned insulating material with a conductive material to form the conductive traces 120 and contact pads 108 and 108'. The conductive traces 120 and contact pads 108 and 108' are formed using a single lithography mask and patterning process in some embodiments, for example. Alternatively, the conductive traces 120 and contact pads 108 and 108' may be formed using other methods and may be formed in two or more metallization layers of the substrate 106.

The contact pads 108 and 108' are exposed through an insulating material 118 disposed on a surface of the substrate 106. The insulating material 118 may comprise silicon nitride, silicon dioxide, other insulators, or combinations or multiple layers thereof. The conductive traces 120 reside beneath the insulating material 118 and make electrical contact with (e.g., are coupled to) the contact pads 108 and 108'. The conductive traces 120 may comprise horizontal connections for the package 102, and may comprise fan-out wiring that is coupled to bond pads 136 (not shown in FIG. 3; see FIG. 6) on an opposite (e.g., bottom) side of the substrate 106.

In accordance with embodiments of the present disclosure, conductive traces 120 are extended in the corners 112 or corner regions 114 of the array region 115 of contact pads 108 and 108' of the package 102. The extended material of the conductive traces 120 is referred to herein as an extension 124 (not shown in FIG. 3; see FIG. 4B) of the conductive traces 120, to be described further herein.

Figure 4A:
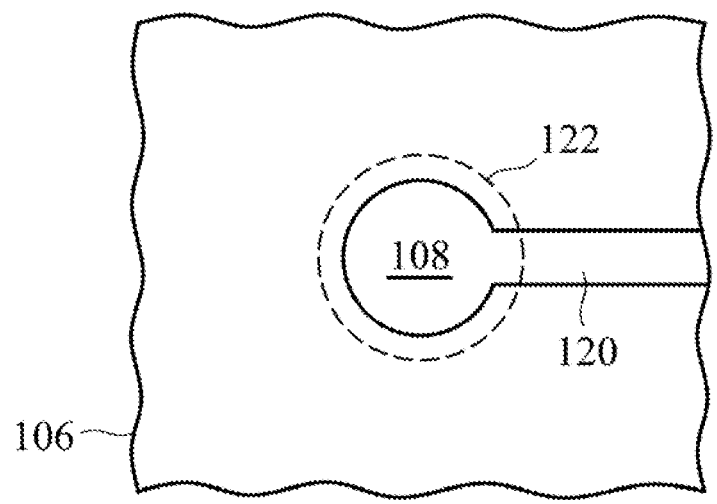
FIG. 4A shows a more detailed top view of a contact pad with a conductive trace coupled to one side.

FIG. 4A shows a more detailed top view of a contact pad 108 having a conductive trace 120 coupled to one side. The structure illustrated shows an original design layout before an implementation of the present disclosure. The circle shown in phantom illustrates a connection region boundary 122 proximate the contact pad 108, to be described further herein with reference to FIGS. 7 and 8. The connection region boundary 122 comprises a solder ball landing region wherein a solder joint 130 will be formed (see FIG. 6). The connection region boundary 122 comprises an edge of a portion of an under-ball metallization (UBM) structure 150 disposed over the contact pad 108 (see FIG. 7) or a widest portion of a solder joint 130 coupleable to the package 102 (see FIG. 8), in some embodiments, as examples.

Figure 4B:
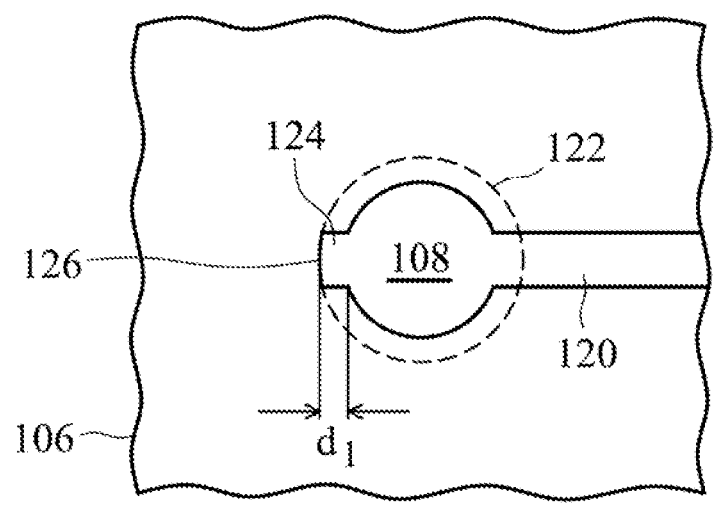
FIGS. 4B and 4C illustrate embodiments of the present disclosure wherein an extension of the conductive trace in FIG. 4A is coupled to the contact pad on an opposite side of the conductive trace.
Figure 4C:
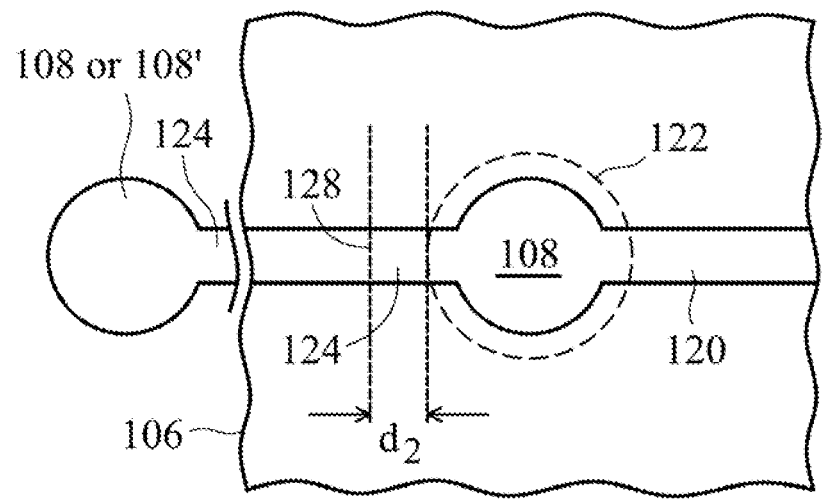

FIGS. 4B and 4C illustrate embodiments of the present disclosure wherein an extension 124 of the conductive trace 120 shown in FIG. 4A is coupled to the contact pad 108 on an opposite side of the conductive trace 120. In FIG. 4B, the extension 124 comprises a length comprising dimension $d_1$, wherein dimension $d_1$ comprises several mm to several μm or less, for example. Alternatively, dimension $d_1$ may comprise other values. The extension 124 extends fully beneath a connection region boundary 122 proximate the contact pad 108 in this embodiment. An edge 126 of the extension 124 is substantially aligned with the connection region boundary 122, as shown, for example. A width of the extension 124 of the conductive trace in a top view comprises substantially a same width as a width of the conductive trace 120.

Adding the extension 124 to the layout of the conductive material layer that the contact pad 108 and conductive trace 120 are formed is advantageously improves a subsequently formed solder joint 130 (see FIG. 6) that is connected to the contact pad 108. The extension 124 provides additional material below the solder joint 130, resulting in an improved solder joint 130 formation, because of increased thermal conductivity due to the presence of the extension 124 in close proximity to the solder joint 130.

FIG. 4C illustrates two other embodiments of the present disclosure. The extension 124 of the conductive trace 120 comprises a length that is greater than dimension $d_1$ in these embodiments. An edge of the extension 124 is shown at 128 in phantom. The extension 124 of the conductive trace 120 may comprise a length comprising dimension $d_2$, wherein dimension $d_2$ comprises several mm to several μm or less, for example. Alternatively, dimension $d_2$ may comprise other values. The extension 124 extends past the connection region boundary 122 proximate the contact pad 108 in this embodiment. A width of the extension 124 of the conductive trace in a top view comprises substantially a same width as a width of the conductive trace 120.

In another embodiment illustrated in FIG. 4C, the extension 124 of the conductive trace 120 may extend elsewhere on the substrate 106 of the package 102. The extension 124 may extend lengthwise along the substrate 106 and make electrical contact to another contact pad 108 or 108', as shown on the left in FIG. 4C. In other embodiments, the extension 124 of the conductive trace 120 may extend lengthwise along the substrate 106 and may not connect to another contact pad 108 or 108' or other conductive element, not shown.

Figure 4D:
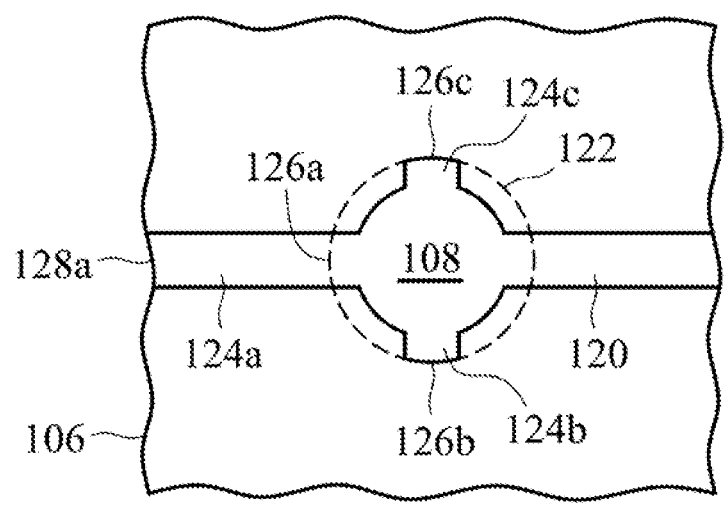
FIGS. 4D and 4E illustrate embodiments wherein three extensions of the conductive trace shown in FIG. 4A are coupled to the contact pad.
Figure 4E:
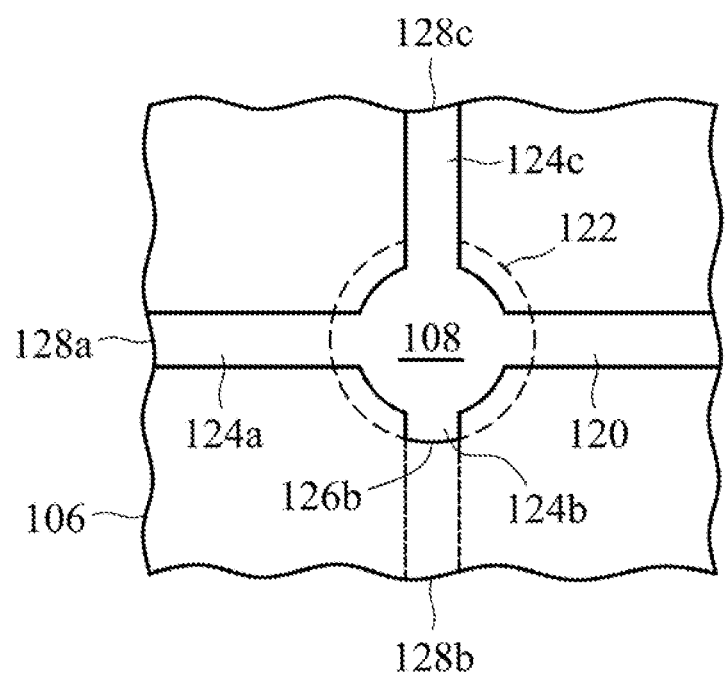

FIGS. 4D and 4E illustrate embodiments wherein three extensions 124a, 124b, and 124c of the conductive trace 120 shown in FIG. 4A are coupled to the contact pad 108. In FIG. 4D, an extension 124a is coupled to a side of the contact pad 108 opposite the side the conductive trace 120 is coupled to. The extension 124a may extend past the connection region boundary 122 and have an edge 128a, or the extension 124a may have an edge 126a that is aligned substantially with the connection region boundary 122, as shown in phantom. Extension 124a comprises a first extension 124a of the conductive trace 120 in this embodiment. A second extension 124b of the conductive trace 120 is coupled to a third side of the contact pad 108, and a third extension 124c of the conductive trace 120 is coupled to a fourth side of the contact pad 108. The fourth side of the contact pad 108 is opposite the third side of the contact pad 108. The second extension 124b and the third extension 124c have edges 126a and 126b, respectively, that are aligned substantially with the connection region boundary 122, as shown. The second extension 124b and the third extension 124c are coupled to the contact pad 108 in a substantially perpendicular direction from the first extension 124a and the conductive trace 120, for example.

Alternatively, as shown in FIG. 4E, the edges 128b (shown in phantom) and 128c of the second extension 124b and third extension 124c, respectively, may extend past the connection region boundary 122 by a predetermined amount comprising dimension $d_2$ (see FIG. 4C), to another contact pad 108 or 108', or elsewhere on the substrate 106.

In FIGS. 4B through 4E, balanced structures are achieved for the contact pad 108 wherein the extensions 124, 124a, 124b, and 124c provide additional conductive material proximate the contact pad 108 within or past the connection region boundary 122. The extensions 124, 124a, 124b, and 124c of the conductive trace 120 proximate the contact pad 108 strengthen a solder joint (see solder joints 130 in FIG. 6) that is later formed on the contact pad 108, providing a more robust connection in the corners 112 and corner regions 114 of the contact pad array region 115 of the substrate 106.

Figure 5A:
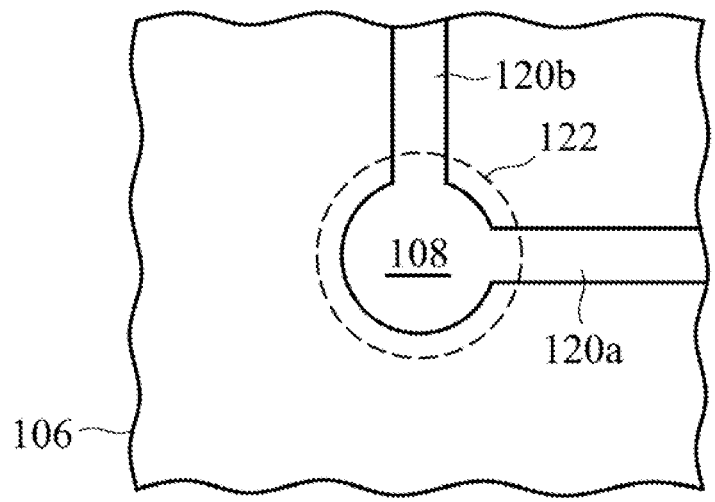
FIG. 5A shows a more detailed view of a contact pad having two conductive traces coupled to two sides of the contact pad.
Figure 5B:
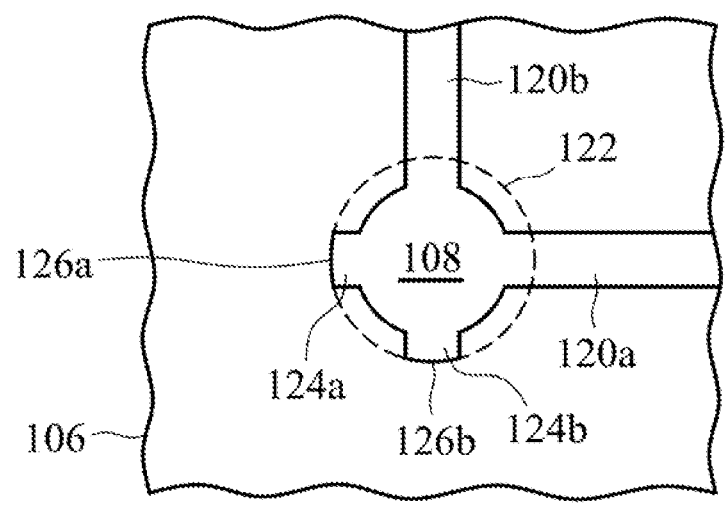
FIGS. 5B, 5C, and 5D illustrate embodiments of the present disclosure wherein extensions of the two conductive traces shown in FIG. 5A are coupled to the contact pad.
Figure 5C:
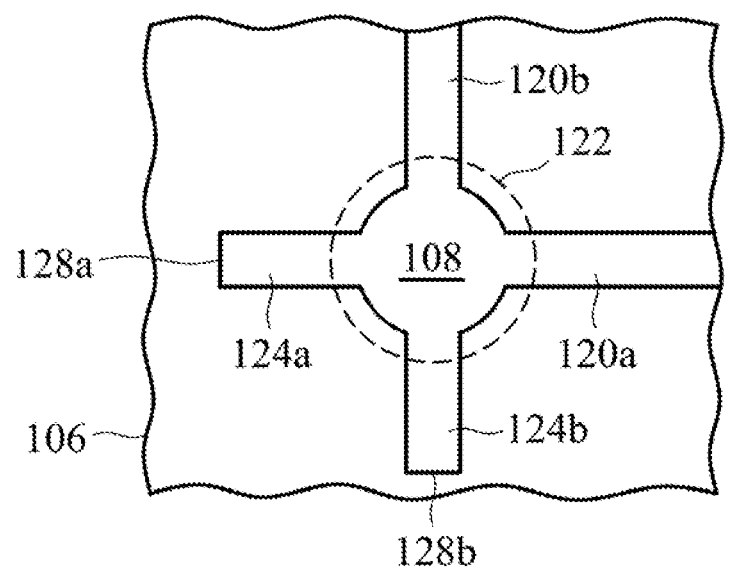
Figure 5D:
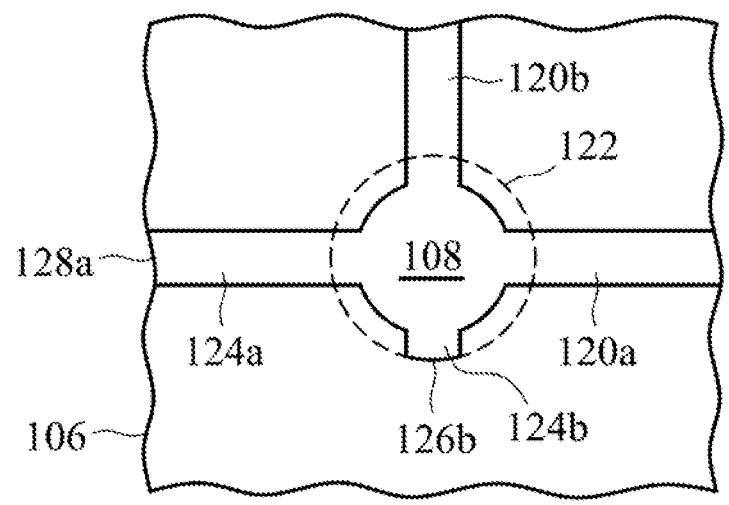

In some designs, two conductive traces 120a and 120b may be coupled to a contact pad 108, as shown in FIG. 5A in a top view. The contact pad 108 has two conductive traces 120a and 120b coupled to two substantially perpendicular sides of the contact pad 108, i.e., the right side and the top side of the contact pad 108, respectively. In accordance with embodiments, the conductive traces 120a and 120b are extended to sides opposite the sides the traces 120a and 120b are formed on, to provide a balanced structure and strengthen a subsequently formed solder joint (see solder joints 130 in FIG. 6). FIGS. 5B, 5C, and 5D illustrate embodiments of the present disclosure wherein extensions 124a and 124b of the two conductive traces 120a and 120b shown in FIG. 5A are coupled to the contact pad 108.

In FIG. 5B, an extension 124a is coupled to the contact pad 108 on the left side opposite the right side that conductive trace 120a is coupled to. An extension 124b is coupled to the contact pad 108 on the bottom side opposite the top side that conductive trace 120b is coupled to. The extensions 124a and 124b have edges 126a and 126b, respectfully, that fully extend within the connection region boundary 122. Alternatively, the extensions 124a and 124b may have edges 128a and 128b that extend past the connection region boundary 122, as shown in FIG. 5C. Alternatively, one extension 124a may have an edge 128a that extends past the connection region boundary 122, and the other extension 124b may have an edge 126a that fully extends within the connection region boundary 122, as shown in FIG. 5D. The extensions 124a and/or 124b may extend past the connection region boundary 122 by a predetermined amount comprising dimension $d_2$ (see FIG. 4C), to another contact pad 108 or 108', or elsewhere on the substrate 106, as described for other embodiments herein.

Figure 6:
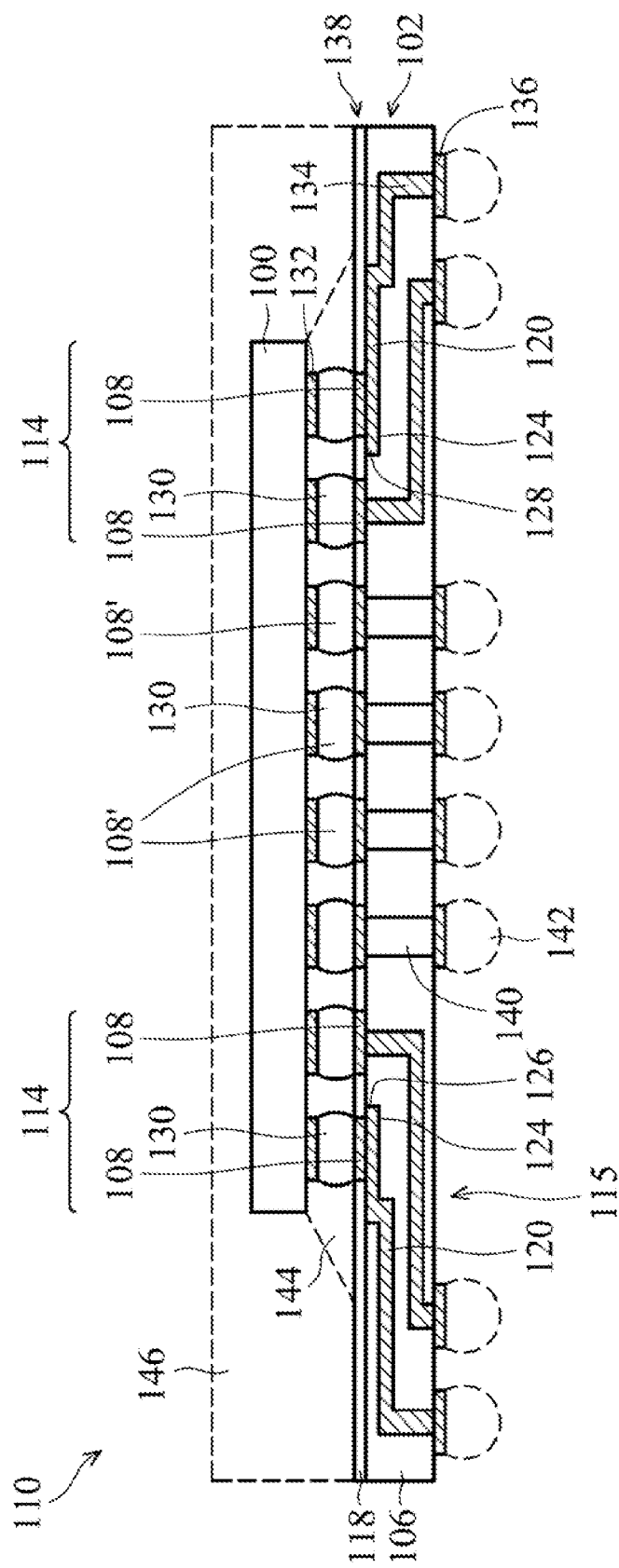
FIG. 6 is a cross-sectional view of an example of a packaged integrated circuit in accordance with an embodiment, illustrating solder joints formed between the integrated circuit die and the package.

FIG. 6 is a cross-sectional view of an example of a packaged integrated circuit 110 in accordance with an embodiment, illustrating solder joints 130 formed between the integrated circuit die 100 and the package 102. The solder joints 130 are formed between contacts 132 on the integrated circuit die 100 and the contact pads 108 and 108' on the package 102. The contact pads 108 with extensions 124 are disposed in corner regions 114 of the array region 115 of contact pads 108 and 108' in the embodiment shown. The package 102 includes wiring 134 formed in one or more metallization layers formed in the substrate 106. The contact pads 108 and 108', conductive traces 120, and extensions 124 are formed in one or more metallization layers of the wiring 134. The substrate 106 may include an optional redistribution layer (RDL) 138 formed therein. The wiring 134 may comprise a portion of the RDL, for example. The RDL may include a fan-out region to expand a footprint of the die 100 so that the footprint of bond pads 136 on the bottom surface of the package 102 is larger than the footprint of the contacts 132 on the die 100, as another example.

In some embodiments, a plurality of through-substrate vias (TSVs) 140 may be formed in the substrate. The TSVs 140 may be coupled to the vias 116 shown in FIG. 3 in some embodiments, for example. A plurality of bond pads 136 are formed on a bottom surface of the package 102, as shown. The bond pads 136 provide connection regions for making electrical contact to the packaged semiconductor device 110, e.g., in an end application. The TSVs 140 may or may not be coupled to the bond pads 136, depending on the design. A plurality of solder balls 142 may optionally be attached to the bond pads 136 of the packaged semiconductor device 110, as shown in phantom.

An underfill material 144 comprising an insulating material may optionally be applied between the die 100 and the package 102, as shown in phantom. The underfill material 144 may comprise an epoxy or a polymer, as examples. A molding compound 146 also comprising an insulating material may optionally be disposed over the die 100 and exposed portions of the package 102, also shown in phantom in FIG. 6. The molding compound 146 may comprise similar materials as the underfill material 144. Alternatively, the molding compound 146 and the underfill material 144 may comprise other materials and may not be included in the packaged semiconductor device 110.

Figure 7:
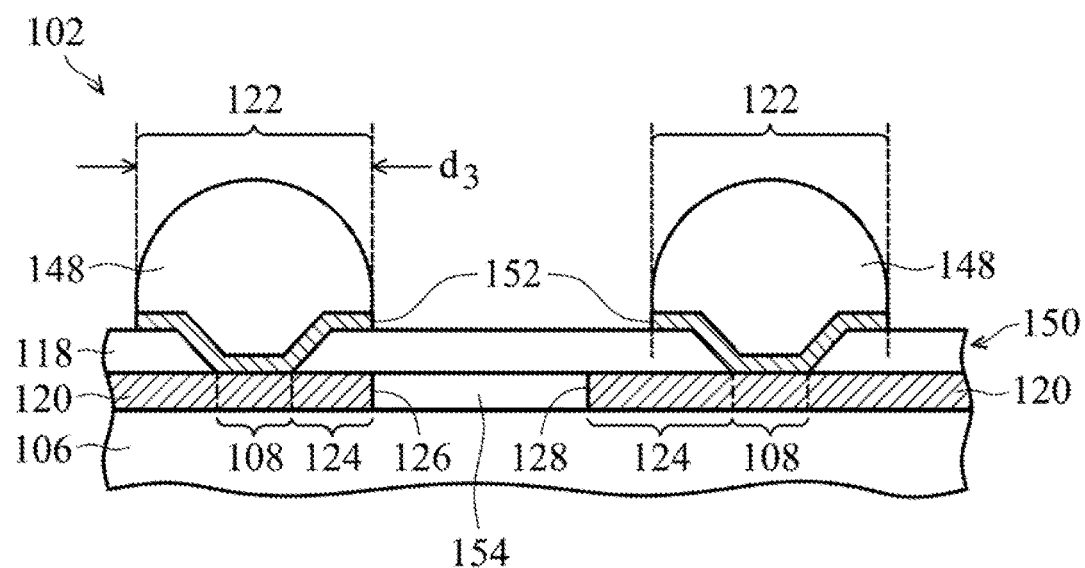
FIG. 7 illustrates a package having an under-ball metallization (UBM) structure disposed over a contact pad in accordance with an embodiment.

FIG. 7 illustrates a portion of a package 102 having an under-ball metallization (UBM) structure 150 disposed over contact pads 108 in accordance with an embodiment. Solder balls 148 are coupled to the package 120 in the embodiment shown. Solder balls 104 may not be coupled to the die 100, or solder balls 104 may also be coupled to the die 100 in this embodiment, for example. The UBM structure 150 is formed over an insulating material 118 disposed over the conductive traces 120, contact pads 108 and extensions 124. The UBM structure 150 includes conductive features 152 comprising a metal formed within and over portions of insulating material 118. The UBM structure 150 is optional and facilitates the formation of the solder balls 148, and/or facilitates adhering solder balls 104 on the die 100 to the package 102.

A cross-sectional view of the conductive traces 120, contact pads 108, and extensions 124 is also shown in FIG. 7. The extension 124 under the left solder ball 148 comprises an edge 126 that is substantially aligned with an edge of connection region boundary 122 which comprises an edge of the UBM structure 150 beneath the solder ball 148 in this embodiment. The connection region boundary 122 may comprise an edge of a portion of the UBM structure 150 disposed over the contact pad 108, for example. Advantageously, the extension 124 extends fully beneath the connection region boundary 122. The extension 124 under the right solder ball 148 comprises an edge 128 that extends past the edge of connection region boundary 122. The dimension $d_3$ comprises a width of the UBM structure 150, wherein dimension $d_3$ comprises several mm to several μm or less, for example, although alternatively, dimension $d_3$ may comprise other values. The dimension $d_3$ illustrates a dimension and location of the connection region boundary 122, for example.

Figure 8:
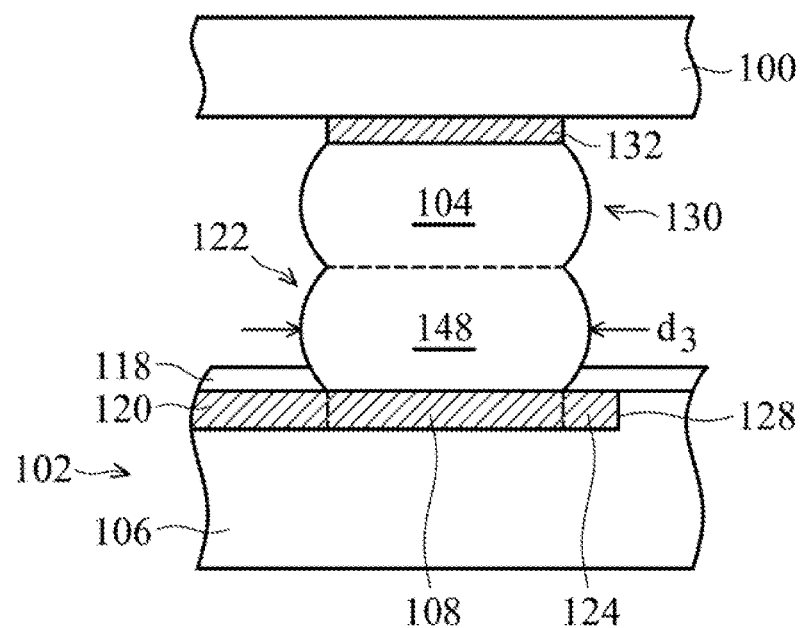
FIG. 8 illustrates a cross-sectional view of a solder joint in accordance with an embodiment.

FIG. 8 illustrates a more detailed cross-sectional view of a solder joint 130 in accordance with an embodiment. Solder balls 104 and 148, respectively are formed on both the die 100 and the package 102 in this embodiment, as an example. The solder joint 130 comprises the solder material of both the solder balls 104 and solder balls 148 after the solder reflow process. A cross-sectional view of a conductive trace 120, contact pad 108, and extension 124 is also shown in FIG. 8. The extension 124 under the solder joint 130 comprises an edge 128 that extends past an edge of connection region boundary 122 which comprises a widest portion of the solder joint 130 in this embodiment. Advantageously, the extension 124 extends fully beneath the connection region boundary 122 and furthermore, also extends past the edge of connection region boundary 122. The dimension $d_3$ comprises a width of a widest portion of the solder joint 130, which may comprise a width of solder balls 104 and/or 148, for example.

Before a solder ball 148 is attached to a contact pad 108', an opening in the insulating material 118 is formed over the contact pad 108. The opening may be formed using a method typically used for a non-solder mask defined (NSMD) process or a solder mask defined (SMD) process, e.g., for ball grid array (BGA) landing region function or other techniques. The combined contact pad 108/conductive trace 120 shape is modified in accordance with embodiments described herein to include the extension 124 of the conductive trace 120 in the conductive layer.

Figure 9:
FIG. 9 is a flow chart illustrating a method of packaging a semiconductor device in accordance with an embodiment of the present disclosure.

FIG. 9 is a flow chart 160 illustrating a method of packaging a semiconductor device in accordance with an embodiment of the present disclosure. In step 162, a package 102 is provided as described herein that includes a conductive trace 120 coupled to a first side of a contact pad 108 and an extension 124 of the conductive trace 120 coupled to the second side of the contact pad 108. In step 164, an integrated circuit die 100 is provided. In step 166, the integrated circuit die 100 is coupled to the contact pad 108; e.g., to a plurality of contact pads 108 and 108'. In an optional step 168, an underfill material 144 may be formed between the integrated circuit die 100 and the package 102. In an optional step 170, a molding compound 146 may be formed over the integrated circuit die 100. Alternatively, steps 168 and 170 may be omitted.

Embodiments of the present disclosure include the novel semiconductor device packages 102 described herein, and also include packaged semiconductor devices 110 that include the packages 102. Embodiments of the present disclosure also include methods of packaging semiconductor devices using the packages 102 described herein.

Advantages of embodiments of the disclosure include providing novel packages 102 having extensions 124, 124a, 124b, and 124c coupled to opposing sides of contact pads 108 from conductive traces 120 in corners 112 and/or corner regions 114 of array regions 115 of contact pads 108 and 108'. The extensions 124, 124a, 124b, and 124c improve the formation of solder joints 130 and result in enhanced drop test lifetime, e.g., during drop tests or in end applications that the packaged semiconductor device 110 is used in. The ratio of NSMD and UBM to contact pad 108 and 108' size ratio is advantageously unchanged according with embodiments.

The extensions 124, 124a, 124b, and 124c may be included in a conductive material layer that the conductive traces 120 and contact pads 108 and 108' are formed in. Thus, no additional lithography masks or lithography processes are required to implement embodiments of the disclosure. Rather, an existing lithography mask can be modified in order to implement the novel extensions 124, 124a, 124b, and 124c into the conductive material layer layout.

The extensions 124, 124a, 124b, and 124c added in the contact pad 108 conductive material layer are balanced about the contact pad 108, either in two directions as shown in FIGS. 4B and 4C or in four directions, as shown in FIG. 4D and FIGS. 5B through 5D. In some embodiments, the extensions 124, 124a, 124b, and 124c provide symmetric conductive material added proximate the contact pads 108, as shown in FIGS. 4C and 5C. The novel extensions 124, 124a, 124b, and 124c are added to contact pads 108 at the corners or corner regions of the die 100 and package 102, e.g., in the corners 112 or corner regions 114 of the array region 115 of the contact pads 108 and 108', as described herein. The extensions 124, 124a, 124b, and 124c may also be added to other contact pads 108' in other regions of the array region 115, in some embodiments.

Without the novel extensions 124, 124a, 124b, and 124c of the conductive traces 120 included in the layout, joint cracks may tend to form between the contact pads 108 and 108' and solder balls 104 and/or 144 in some applications, particularly in corners 112 and corner regions 114 of the array region 115 of contact pads 108 and 108'. Including the novel extensions 124, 124a, 124b, and/or 124c of the conductive traces 120 in accordance with embodiments improves the solder joint 130 formation, due to the additional conductive material disposed beneath the solder joints 130, which increases thermal conductivity of the solder material of the solder joints 130. The improved, more robust solder joints 130 formed improve packaged device 110 yields, improve packaged device 110 drop test results, and increase packaged device 110 lifetimes. Furthermore, the novel packages 102 and packaging methods described herein are easily implementable in packaging process flows.

In accordance with one embodiment of the present disclosure, a package for a semiconductor device includes a substrate and a contact pad disposed on a first surface of the substrate. The contact pad has a first side and a second side opposite the first side. A conductive trace is coupled to the first side of the contact pad, and an extension of the conductive trace is coupled to the second side of the contact pad. A plurality of bond pads is disposed on a second surface of the substrate.

In accordance with another embodiment, a packaged semiconductor device includes a package including a substrate and a contact pad disposed on a top surface of the substrate. The contact pad has a first side and a second side opposite the first side. A conductive trace is coupled to the first side of the contact pad, and an extension of the conductive trace is coupled to the second side of the contact pad. The package also includes a plurality of bond pads disposed on a bottom surface of the substrate. An integrated circuit die is coupled to the contact pad on the top surface of the substrate of the package.

In accordance with yet another embodiment, a method of packaging a semiconductor device includes providing a package including a substrate and an array region of a plurality of first contact pads and a plurality of second contact pads disposed on a first surface of the substrate. The array region has a plurality of corners. One of the plurality of first contact pads is disposed in each of the plurality of corners of the array region. The first contact pads have a first side and a second side opposite the first side. A conductive trace is coupled to the first side of each of the first contact pads, and an extension of the conductive trace is coupled to the second side of each of the first contact pads. A plurality of bond pads is disposed on a bottom surface of the substrate. An integrated circuit die is provided, and the integrated circuit die is coupled to the first contact pads and the plurality of second contact pads in the array region of the package.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A package for a semiconductor device, comprising:
a substrate having a first surface and a second surface opposite the first surface;
an integrated circuit die covering a portion of the first surface of the substrate;
a first contact pad disposed on the first surface of the substrate, the first contact pad having a first side and a second side opposite the first side;
a second contact pad disposed on the first surface of the substrate, the second contact pad having a third side and a fourth side opposite the third side;

a first conductive trace disposed within the substrate, the first conductive trace coupled to the first side of the first contact pad, the first conductive trace having a first bridging portion disposed fully across a surface of the first contact pad;
a second conductive trace disposed within the substrate, the second conductive trace coupled to the third side of the second contact pad, the second conductive trace having a second bridging portion disposed fully across a surface of the second contact pad;
a first extension of the first conductive trace coupled to the first bridging portion of the first conductive trace, wherein:
the first conductive trace, the first extension of the first conductive trace, and the first bridging portion of the first conductive trace are coplanarly disposed at a first level;
the first contact pad is disposed at a second level different from the first level; and
the first extension of the first conductive trace comprises a first lateral edge of extension, the first lateral edge of extension distally disposed from the first bridging portion;
a second extension of the second conductive trace coupled to the second bridging portion of the second conductive trace, wherein:
the second conductive trace, the second extension of the second conductive trace, and the second bridging portion of the second conductive trace are coplanarly disposed at the first level;
the second contact pad is disposed at the second level; and
the second extension of the second conductive trace comprises a second lateral edge of extension, the second lateral edge of extension distally disposed from the second bridging portion;
a first connection region boundary comprising a first solder ball landing region, the first connection region boundary disposed over the first contact pad, the first connection region boundary comprising a first lateral extent of the first contact pad, the first lateral extent of the first contact pad proximate the first lateral edge of extension, wherein the first lateral edge of extension is coplanarly aligned with the first lateral extent of the first contact pad in a direction normal to the first surface of the substrate;
a second connection region boundary comprising a second solder ball landing region, the second connection region boundary disposed over the second contact pad, the second connection region boundary comprising a second lateral extent of the second contact pad, the second lateral extent of the second contact pad proximate the second lateral edge of extension, wherein the second lateral edge of extension is disposed distally from the second lateral extent of the second contact pad, the second lateral edge of extension is not disposed directly under the second contact pad, and the second lateral edge of extension is not coplanarly aligned with the second lateral extent of the second contact pad in a direction normal to the first surface of the substrate;
an insulating layer disposed over and fully covering the first extension of the first conductive trace and the second extension of the second conductive trace; and
a plurality of bond pads disposed on a second surface of the substrate, wherein the first conductive trace is coupled to a first bond pad of the plurality of bond pads, the second conductive trace is coupled to a second bond pad of the plurality of bond pads, and the first bond pad and second bond pad are disposed outside a lateral extent of the integrated circuit die.

2. The package according to claim 1, wherein at least one of the first contact pad or the second contact pad is located in a corner of an array region of the substrate.

3. The package according to claim 1,
wherein the first contact pad further comprises a fifth side and a sixth side opposite the fifth side, wherein:
a third extension of the first conductive trace is coupled to the fifth side of the first contact pad; and
a fourth extension of the first conductive trace is coupled to the sixth side of the first contact pad.

4. The package according to claim 1, wherein the first contact pad further comprises a fifth side and a sixth side opposite the fifth side, wherein:
a third conductive trace is coupled to the fifth side of the first contact pad; and
a third extension of the third conductive trace is coupled to the sixth side of the first contact pad.

5. The package of claim 1, wherein the package comprises a printed circuit board (PCB).

6. The package of claim 1, further comprising an underfill material disposed between the integrated circuit die and the substrate, or a molding compound disposed over the integrated circuit die.

7. The package according to claim 3, wherein the second contact pad further comprises a seventh side and an eighth side opposite the seventh side, wherein:
a fifth extension of the second conductive trace is coupled to the seventh side of the second contact pad; and
a sixth extension of the second conductive trace is coupled to the eighth side of the second contact pad.

8. The package according to claim 4, wherein the second contact pad further comprises a seventh side and an eighth side opposite the seventh side, wherein:
a fourth conductive trace is coupled to the seventh side of the second contact pad; and
a fourth extension of the fourth conductive trace is coupled to the eighth side of the second contact pad.

9. A device, comprising:
a first contact pad and a second contact pad disposed on a top surface of a substrate;
a first solder joint disposed over the first contact pad, an outermost first extent of the first solder joint in a plan view defining a first connection region boundary;
a first conductive trace coupled to the first contact pad, the first conductive trace having a first bridging portion disposed fully across a first surface of the first contact pad, the first conductive trace comprising a first extension coupled to the first bridging portion, wherein the first extension of the first conductive trace fully extends to the first connection region boundary;
a second solder joint disposed over the second contact pad, an outermost second extent of the second solder joint in the plan view defining a second connection region boundary;
a second conductive trace coupled to the second contact pad, the second conductive trace having a second bridging portion disposed fully across a second surface of the second contact pad, the second conductive trace comprising a second extension coupled to the second bridging portion, wherein the second extension of the second conductive trace extends past the second connection region boundary;
an insulating layer disposed over and fully covering the first extension of the first conductive trace;

a plurality of bond pads disposed on a bottom surface of the substrate; and an integrated circuit die disposed over and coupled to the first contact pad, wherein the first conductive trace is electrically coupled to a bond pad of the plurality of bond pads, the bond pad being disposed laterally adjacent the first connection region boundary.

10. The device of claim 9, wherein the first contact pad is disposed in a corner of an array region of a plurality of contact pads on the substrate, and wherein the integrated circuit die is coupled to each of the plurality of contact pads.

11. The device of claim 9, wherein the second contact pad is disposed in a corner of an array region of a plurality of contact pads on the substrate, and wherein the integrated circuit die is coupled to each of the plurality of contact pads.

12. The device of claim 9, wherein the substrate comprises a printed circuit board (PCB).

13. The device of claim 9, wherein a first sidewall of the insulating layer is coplanar with a second sidewall of the substrate.

14. A method comprising:

disposing a first contact pad on a top surface of a substrate, wherein a first conductive trace is coupled to the first contact pad, the first conductive trace having a first bridging portion disposed fully across a first surface of the first contact pad, the first conductive trace comprising a first extension coupled to the first bridging portion;

forming a first solder joint over the first contact pad, wherein a first connection region boundary is defined in a plan view by an outermost first extent of the first solder joint, and the first extension of the first conductive trace extends to and terminates at the first connection region boundary;

disposing a second contact pad on the top surface of the substrate, wherein a second conductive trace is coupled to the second contact pad, the second conductive trace having a second bridging portion disposed fully across a second surface of the second contact pad, the second conductive trace comprising a second extension coupled to the second bridging portion;

forming a second solder joint over the second contact pad, wherein a second connection region boundary is defined in the plan view by an outermost second extent of the second solder joint, and the second extension of the second conductive trace extends past the second connection region boundary;

forming a plurality of bond pads on a bottom surface of the substrate; and coupling an integrated circuit die to the first contact pad, wherein the first conductive trace is electrically coupled to a bond pad of the plurality of bond pads, and the bond pad is disposed laterally adjacent the first connection region boundary.

15. The method of claim 14, further comprising disposing an insulating layer over and fully covering the first extension of the first conductive trace and the second extension of the second conductive trace.

16. The method of claim 14, further comprising disposing an underfill material between the integrated circuit die and the substrate.

17. The method of claim 14, further comprising disposing a molding compound over the integrated circuit die.

18. The method of claim 17, wherein a first lateral sidewall of the substrate is coplanar with a second lateral sidewall of the molding compound.

19. The method of claim 14, wherein the substrate comprises a printed circuit board (PCB).

20. The package of claim 6, wherein a first lateral sidewall of the substrate is coplanar with a second lateral sidewall of the molding compound.

* * * * *